(12) United States Patent
Niwa et al.

(10) Patent No.: US 10,262,086 B2
(45) Date of Patent: Apr. 16, 2019

(54) ANALYZING APPARATUS, ANALYZING METHOD, AND COMPUTER PROGRAM

(71) Applicant: NIPPON STEEL & SUMITOMO METAL CORPORATION, Tokyo (JP)

(72) Inventors: Toshiyuki Niwa, Tokyo (JP); Noriyuki Suzuki, Tokyo (JP); Shunji Hiwatashi, Tokyo (JP); Shin Toyokawa, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 974 days.

(21) Appl. No.: 14/372,381

(22) PCT Filed: Mar. 13, 2013

(86) PCT No.: PCT/JP2013/057090
§ 371 (c)(1),
(2) Date: Jul. 15, 2014

(87) PCT Pub. No.: WO2013/146279
PCT Pub. Date: Oct. 3, 2013

(65) Prior Publication Data
US 2015/0066441 A1    Mar. 5, 2015

(30) Foreign Application Priority Data

Mar. 30, 2012  (JP) ................................. 2012-081541

(51) Int. Cl.
*B60C 15/00*   (2006.01)
*G06F 17/50*   (2006.01)

(52) U.S. Cl.
CPC ................................ *G06F 17/5018* (2013.01)

(58) Field of Classification Search
None
See application file for complete search history.

(56) References Cited

U.S. PATENT DOCUMENTS

| 7,308,390 B2 * | 12/2007 | Shiraishi ................ B60C 11/00 703/8 |
| 2008/0033703 A1 * | 2/2008 | Enomoto ............ G06F 17/5018 703/7 |
| 2011/0246150 A1 * | 10/2011 | Miyagi ............... G06F 17/5018 703/2 |

FOREIGN PATENT DOCUMENTS

| JP | 2008-149356 | 7/2008 |
| JP | 2010-049319 | 3/2010 |

OTHER PUBLICATIONS

M.E.H. Benbouzid et al. "Finite Element Modeling of a Synchronous Machine Electromagnetic Forces and Mode Shapes", IEEE Transacilons on Magnetics. vol. 29, No. 2, Mar. 1993 (Year: 1993).*

(Continued)

*Primary Examiner* — Brian W Wathen
*Assistant Examiner* — Abdou K Seye
(74) *Attorney, Agent, or Firm* — Birch, Stewart, Kolasch & Birch, LLP

(57) ABSTRACT

An analyzing apparatus generates first displacement distribution data indicating a displacement distribution of a member caused by springback based on finite element model data, material physical property data, and stress distribution data; generates second displacement distribution data indicating an amount of displacement of the member in each of a plurality of, for example, all, natural vibration deformation modes based on the finite element model data and the material physical property data; obtains a degree of coincidence between the first displacement distribution data and each of the second displacement distribution data, and selects one or more natural vibration deformation modes based on the degree of coincidence, to determine a modified shape in which natural vibrations are increased, thereby bringing the member closer to a target shape.

12 Claims, 9 Drawing Sheets

(56) References Cited

OTHER PUBLICATIONS

International Preliminary Report on Patentability dated Oct. 9, 2014 issued in corresponding PCT Application No. PCT/JP2013/057090.
Second and Supplementary Notice Informing the Applicant of the Communication of the International Application dated Jul. 31, 2014 issued in corresponding PCT Application No. PCT/JP2013/057090.
International Search Report dated May 21, 2013 issued in corresponding PCT Application No. PCT/JP2013/057090 [with English Translation].
Shunji Hiwatashi et al., "Comprehensive Effort for Forming Problems of High-Strength Steel Sheets," Jan. 14, 2005, Sheet Forming Forum Special Lecture, Formation and Quality Improvement Engineering Division (Sokei Sositsu Kogaku Bukai), The Iron and Steel Institute of Japan, pp. 1-5 [with Partial English Translation].

* cited by examiner

ANALYZING APPARATUS, ANALYZING METHOD, AND COMPUTER PROGRAM

FIELD OF THE INVENTION

The present invention relates to an analyzing apparatus, an analyzing method, and a computer program.

BACKGROUND

In response to requests for collision safety and weight reduction, the tensile strength of a steel sheet applied to the body of an automobile or the like has exceeded 590 MPa class, and is now reaching as high as units of GPa. High-strength steel sheets can be provided with increased energy absorption at the time of a collision, increased strength, and the like without increasing sheet thickness. As compared to other light-weight materials, processing of parts, assembly, or the like using high-strength steel sheets do not always require large renovation of equipment and production technology. Therefore, loads of processing of parts, assembly, or the like using high-strength steel sheets on production costs are considered to be relatively small as compared to other light-weight materials.

However, in the case of press forming, springback, wrinkle, and the like increase along with increase in strength of steel sheets, and it becomes difficult to ensure dimensional accuracy of parts. Further, decrease in ductility accompanying increase in strength increases the risk of breakage during press forming. Realizing both performance and productivity with high-strength steel sheets is thus not always easy compared to conventional mild steel sheets.

Of the breakage, wrinkle, and springback described above, breakage and wrinkle are problems that may occur also where conventional mild steel sheets are used depending on the part shape, the forming conditions, and so on, and a multitude of knowledge, counter technology, and the like have been accumulated hitherto. On the other hand, the springback is a problem unique to the case where a high-strength steel sheet is used, for which sufficient studies are not conducted, and it cannot be said that those widely used forming simulations have achieved sufficient practical reliability for dimensional accuracy prediction by springback analysis.

Springback is elastic deformation which occurs in a part to satisfy a new balance with a residual stress being a driving force when an operation which alleviates a constraint on the part is performed, such as an operation to remove a formed product from a die after press forming or an operation to trim an unnecessary portion. The springback is large on the high-strength steel sheets, and hence it is difficult to ensure dimensional accuracy required in a final product.

The springback is categorized into "angular variation," "wall warping," "twisting (strain)," "edge line warping (surface warping)," and "springback of punch bottom" depending on phenomenon. All of them occur as a result of that a residual stress distribution operates in a part as the moment of bending or twisting, and the part deforms according to rigidity determined by elastic coefficient, sheet thickness, part shape, and so on of the material. For example, most well-known springback examples are bending angle variation, wall warping, and the like. For these springbacks, the stress distribution in a sheet thickness direction becomes a driving force, and the rigidity is determined mainly by the sheet thickness. On the other hand, when a beam of a hat cross section curving in a longitudinal direction is draw formed, wall warping and twisting occur, but when curvature of bending is small, part rigidity increases and the wall warping becomes small.

Based on this mechanism, one countermeasure method of dimensional accuracy defect is to change the sheet thickness, the part shape, and/or the like to increase the rigidity corresponding to an elastic deformation mode of springback, thereby increasing resistance to the springback.

Increase in resistance to springback surely decreases dimensional variations. The resistance to springback is the rigidity of a part with respect to the elastic deformation mode thereof. To increase the rigidity of a part, the shape of the part is an important factor. The shape of the part is restricted by requirements such as performance, layout, and so on, and hence small countermeasures such as beads, embossment, and the like are effective.

Beads with respect to wall warping are a most typical rigidity enforcement countermeasure example. On the other hand, it is difficult to find an optimal rigidity reinforcing position with respect to three-dimensional springback in a complicated part. As a new attempt, there has been proposed a method to use natural vibration analysis and optimization together. See Shunji Hiwatashi et al., "Comprehensive Effort For Forming Problems of High-Strength Steel Sheets," Sheet Forming Forum Special Lecture, Formation and Quality Improvement Engineering Division (Sokei Sositsu Kogaku Bukai), The Iron and Steel Institute of Japan (Jan. 14, 2005).

Specifically, focusing attention on that a natural frequency is proportional to the square root of rigidity and is inversely proportional to the square root of density (mass), the elastic deformation mode of springback is identified, the natural vibration deformation mode corresponding to this elastic deformation mode of springback is selected, a part of elements is replaced with a highly elastic material of the same density so that the natural frequency of the natural vibration deformation mode increases, and an optimal disposition of these elements is obtained by using an optimizing tool or the like. It is thus possible to easily find an optimal rigidity reinforcement position.

However, with this method, it is necessary to manually and laboriously select the natural vibration deformation mode. Further, even if the natural vibration deformation mode is selected automatically, the criteria for selection are not clear. Thus, it is not always possible to select the natural vibration deformation mode corresponding to the elastic deformation mode of springback, and it is not always possible to obtain an optimal disposition of highly elastic materials. Accordingly, it is conceivable to select all natural vibration deformation modes and obtain the optimal disposition of highly elastic materials for each mode, but there is a problem that it would cost too much. Thus, it has not been possible to easily perform an analysis for reducing deformation of a member caused by springback.

SUMMARY

Embodiments of the present invention allow for easily selecting the natural vibration deformation mode corresponding to deformation of a member caused by springback, and easily performing an analysis for reducing deformation of a member caused by springback.

According to an example embodiment of the present invention, an analyzing apparatus, which performs an analysis for reducing deformation of a member caused by springback, includes a press forming analyzing unit which obtains finite element model data indicating a shape of the member, material physical property data indicating material physical properties of the member, and stress distribution data indicating a stress distribution which occurs in the member; a springback analyzing unit which obtains by a finite element method a displacement of a node of the finite element model data based on the finite element model data, the material physical property data, and the stress distribution data, and thereby generates first displacement distribution data indicating a displacement distribution of the member caused by the springback; a natural vibration analyzing unit which obtains by the finite element method a displacement of a node of the finite element model data with respect to each of a plurality of natural vibration deformation modes based on the finite element model data and the material physical property data, and thereby generates second displacement distribution data indicating a displacement distribution of the member in the natural vibration deformation mode; a mode decomposing unit which obtains a degree of coincidence between the first displacement distribution data and each of the second displacement distribution data in the natural vibration deformation mode; and a mode selecting unit which selects one or more natural vibration deformation modes based on the degree of coincidence.

According to an example embodiment of the present invention, the analyzing apparatus further includes a bead disposing unit which disposes beads in the finite element model data so that a natural frequency of at least a portion of the one or more natural vibration deformation modes increases, where the shape of the member is determined based on the beads disposed by the bead disposing unit.

According to an example embodiment of the present invention, the mode selecting unit further selects a predetermined number of natural vibration deformation modes in order of degree of coincidence, beginning with the natural vibration deformation mode in which the degree of coincidence is largest.

According to an example embodiment of the present invention, the mode selecting unit further selects one or more natural vibration deformation modes in which the degree of coincidence is larger than a predetermined threshold.

According to an example embodiment of the present invention, an analyzing method, which uses an analyzing apparatus to perform an analysis for reducing deformation of a member caused by springback, includes a press forming analyzing step of obtaining finite element model data indicating a shape of the member, material physical property data indicating material physical properties of the member, and stress distribution data indicating a stress distribution which occurs in the member; a springback analyzing step of obtaining, by a finite element method, a displacement of a node of the finite element model data based on the finite element model data, the material physical property data, and the stress distribution data, and thereby generating first displacement distribution data indicating a displacement distribution of the member caused by the springback; a natural vibration analyzing step of obtaining, by the finite element method, a displacement of a node of the finite element model data with respect to each natural vibration deformation mode based on the finite element model data and the material physical property data, and thereby generating second displacement distribution data indicating a displacement distribution of the member in the natural vibration deformation mode; a mode decomposing step of obtaining a degree of coincidence between the first displacement distribution data and each of the second displacement distribution data in the natural vibration deformation mode; and a mode selecting step of selecting one or more natural vibration deformation modes based on the degree of coincidence.

According to an example embodiment, the analyzing method further includes a bead disposing step of disposing beads in the finite element model data so that a natural frequency of at least a portion of the one or more natural vibration deformation modes increases, where the shape of the member is determined based on the beads disposed in the bead disposing step.

In an example embodiment, in the mode selecting step, a predetermined number of natural vibration deformation modes are selected in order by degree of coincidence, beginning with the natural vibration deformation mode in which the degree of coincidence is largest.

In an example embodiment, in the mode selecting step, one or more natural vibration deformation modes in which the degree of coincidence is larger than a predetermined threshold is or are selected.

According to an example embodiment of the present invention, a computer program, when executed by a computer, causes the computer to execute an analysis for reducing deformation of a member caused by springback by executing: a press forming analyzing step of obtaining finite element model data indicating a shape of the member, material physical property data indicating material physical properties of the member, and stress distribution data indicating a stress distribution which occurs in the member; a springback analyzing step of obtaining, by a finite element method, a displacement of a node of the finite element model data based on the finite element model data, the material physical property data, and the stress distribution data, and thereby generating first displacement distribution data indicating a displacement distribution of the member caused by the springback of the member; a natural vibration analyzing step of obtaining by the finite element method a displacement of a node of the finite element model data with respect to each natural vibration deformation mode based on the finite element model data and the material physical property data, and thereby generating second displacement distribution data indicating a displacement distribution of the member in the natural vibration deformation mode; a mode decomposing step of obtaining a degree of coincidence between the first displacement distribution data and each of the second displacement distribution data in the natural vibration deformation mode; and a mode selecting step of selecting one or more natural vibration deformation modes based on the degree of coincidence.

According to the present invention, based on the degree of coincidence between first displacement distribution data indicating a displacement distribution of a member caused by springback and each of second displacement distribution data indicating a displacement distribution of the member in each natural vibration deformation mode, one or more natural vibration deformation modes are selected including the natural vibration deformation mode corresponding to deformation caused by springback, which enables a user to select the natural vibration deformation mode corresponding to springback deformation. Thus, an analysis for reducing deformation of a member caused by springback can be performed easily.

In the following, the present invention will be described with reference to drawings and example embodiments. However, the description of these specific example embodiments is intended to be illustrative, and not restrictive, and the subject matter of the present invention is not limited to these specific example embodiments. Those skilled in the art can appreciate from the following description that the present invention may be implemented in a variety of forms, and that various described embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and the claims, and the subject matter of the present invention embraces the invention described in the claims and equivalents thereof.

DETAILED DESCRIPTION

Figure 1:
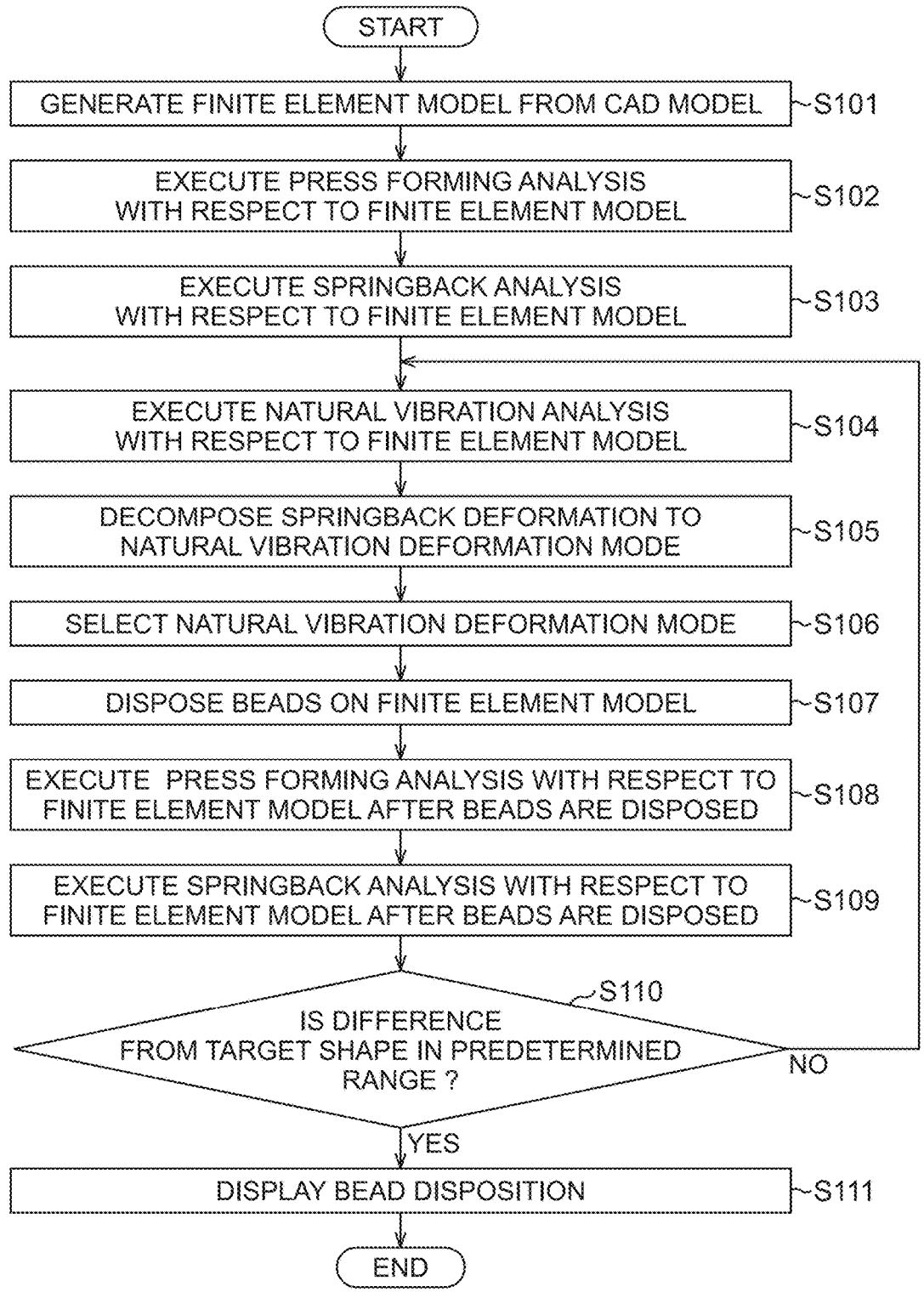
FIG. 1 is a flowchart describing an example of operation of an analyzing apparatus according to an example embodiment of the present invention.
Figure 11:
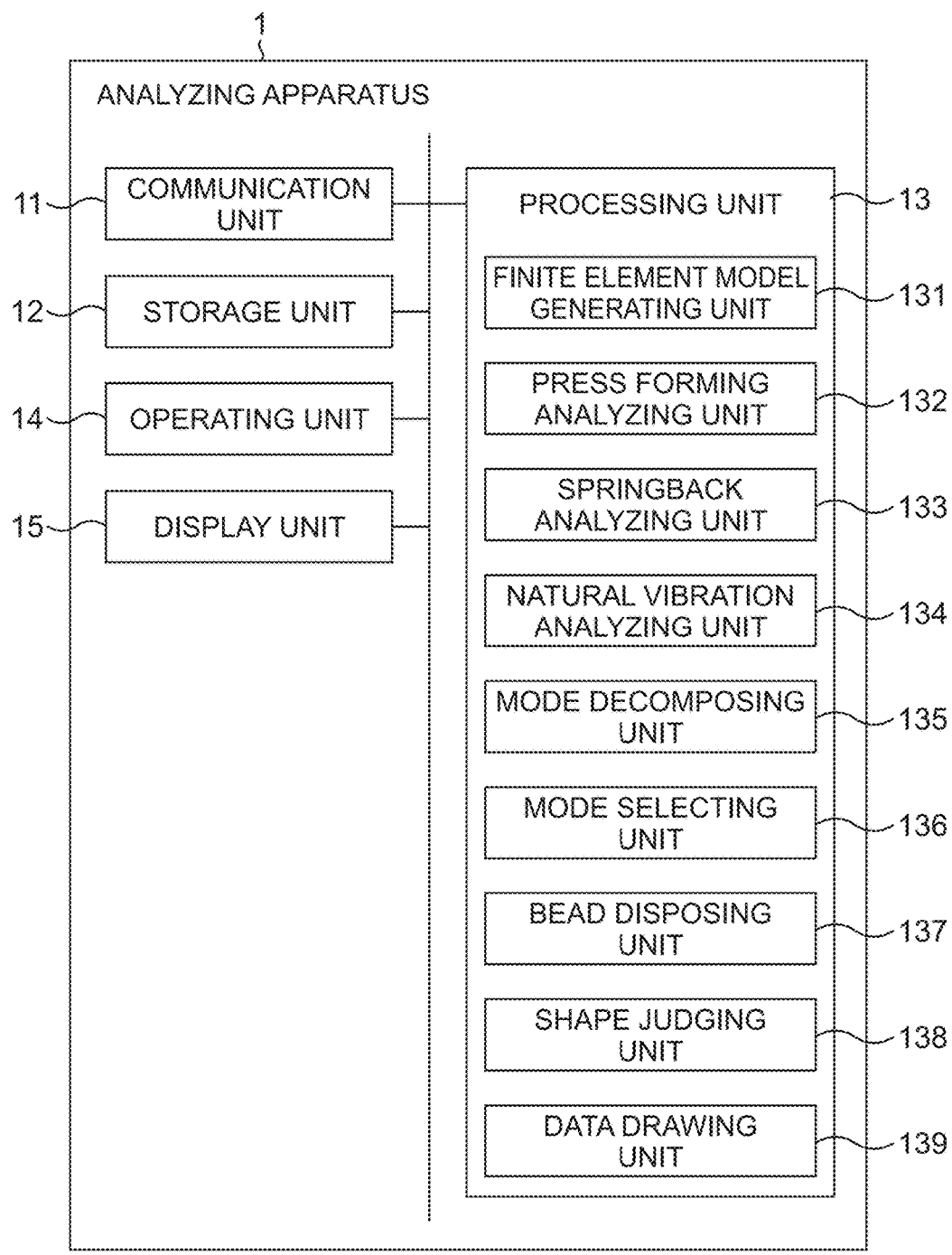
FIG. 11 is a block diagram illustrating an example of a functional structure of the analyzing apparatus according to an example embodiment of the present invention.

FIG. 1 is a flowchart illustrating steps of an example of operation of an analyzing apparatus 1 illustrated in FIG. 11, which is further described below. For example, according to an example embodiment, the processing flow illustrated in FIG. 1 is executed in cooperation with respective elements of the analyzing apparatus 1 mainly by a processing unit 13 of the analyzing apparatus 1 based on a program stored in advance in a storage unit 12 of the analyzing apparatus 1.

First, the processing unit 13 generates finite element model data by dividing the shape of a member into plural elements of particular shapes and sizes based on "CAD model data and generation condition data" stored in the storage unit 12 (step S101). Further, the processing unit 13 stores the generated finite element model data in the storage unit 12. For example, a commercially available application program, such as HyperMesh or ANSA, can be used for generation processing of the finite element model.

Figure 2A:
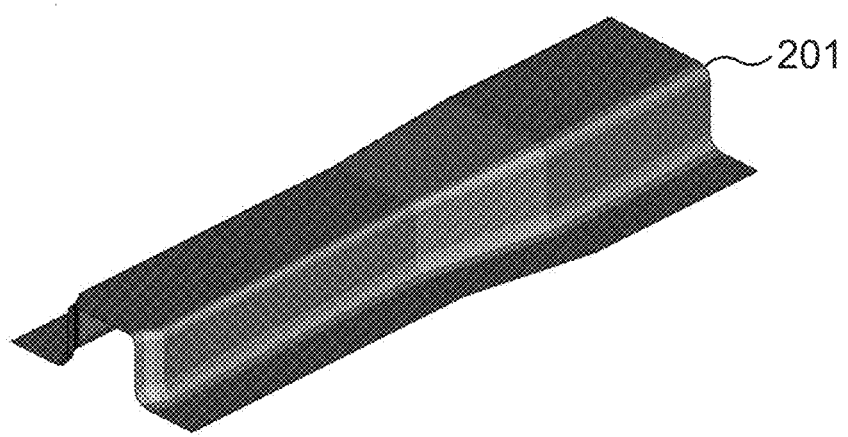
FIG. 2A is a schematic view illustrating an example of a member before being divided into elements, according to an example embodiment of the present invention.
Figure 2B:
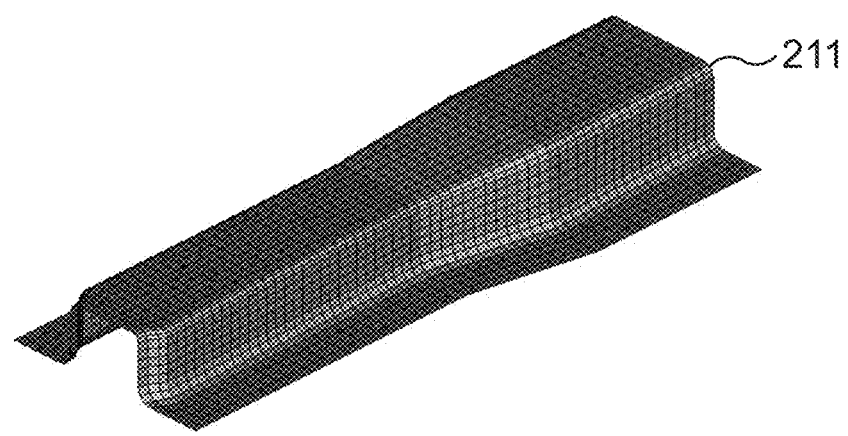
FIG. 2B is a schematic view illustrating an example of a member after being divided into elements, according to an example embodiment of the present invention.

FIG. 2A is a schematic view (perspective view) illustrating an example of a member before being divided into elements. FIG. 2B is a schematic view (perspective view) illustrating an example of a member after being divided into elements. When a member 201 illustrated in FIG. 2A is divided into plural square elements by the processing unit 13, it becomes like a member 211 illustrated in FIG. 2B.

Next, the processing unit 13 obtains a stress which occurs in each element of the member by a finite element method based on the finite element model data, material physical property data, and press forming condition data stored in the storage unit 12, to thereby generate stress distribution data of the member (step S102). The stress distribution data of the member thus include information illustrating the stress which occurs in each element of the member. Further, the processing unit 13 stores the generated stress distribution data in the storage unit 12. A commercially available application program, such as, for example, HyperForm, LS-DYNA, or PAM-STAMP, can be used for press forming analysis.

Figure 3:
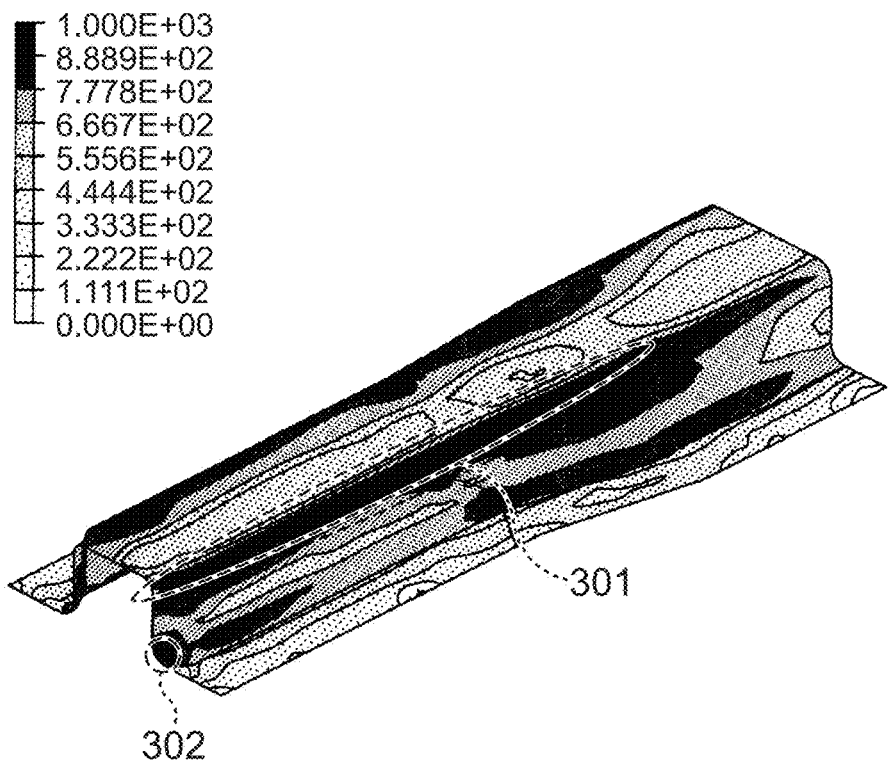
FIG. 3 is a schematic view illustrating an example of a member on which a stress distribution, after press forming according to an example embodiment of the present invention, is illustrated.

FIG. 3 is a schematic view (perspective view) illustrating an example of a member on which a stress distribution after press forming is illustrated. FIG. 3 illustrates magnitudes of stresses obtained by the processing unit 13 by shades of color, and stresses in the range of about 0.000 to $1.000 \times 10^3$ MPa are illustrated. For example, FIG. 3 illustrates that a large stress has occurred in portions 301, 302, and so on.

Next, the processing unit 13 obtains a displacement of each node of the member after springback by the finite element method based on the finite element model data, the stress distribution data, the material physical property data, and boundary condition data stored in the storage unit 12, to thereby generate first displacement distribution data of the member (step S103). The first displacement distribution data thus include information indicating the displacement of each node of the member. Further, the processing unit 13 stores the generated first displacement distribution data in the storage unit 12. A commercially available application program, such as, for example, LS-DYNA or PAM-STAMP, can be used for springback analysis.

Figure 4:
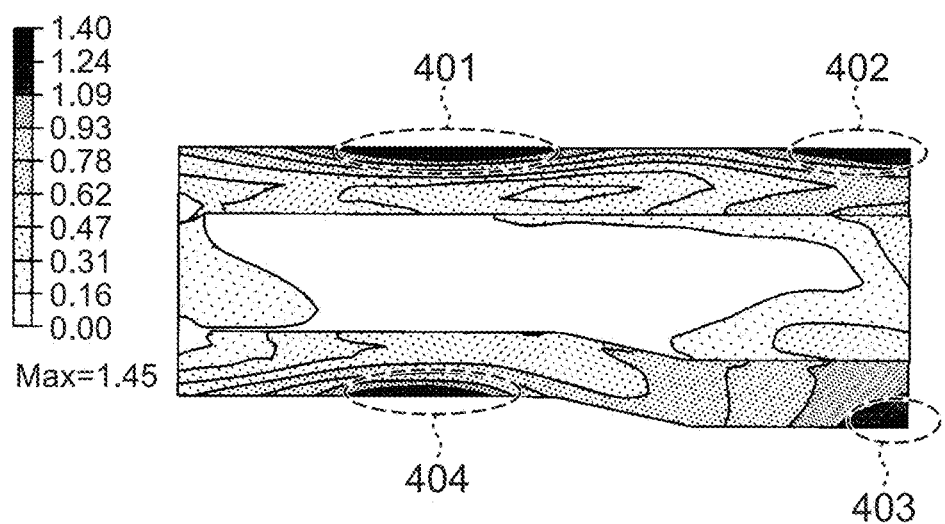
FIG. 4 is a schematic view illustrating an example of a member on which a displacement distribution based on first displacement data, obtained according to an example embodiment of the present invention, is illustrated.

FIG. 4 is a schematic view (plan view) illustrating an example of a member on which a displacement distribution based on the first displacement data is illustrated. In FIG. 4, magnitudes of displacements obtained by the processing unit 13 are illustrated by shades of color, and displacements in the range of about 0.00 mm to 1.40 mm are illustrated. For example, portions 401 to 404, and so on are displaced largely, and are displaced up to 1.45 mm (see "Max=1.45" of FIG. 4).

Next, the processing unit 13 obtains a displacement of each node of the member by the finite element method with respect to each natural vibration deformation mode based on the finite element model data, the material physical property data, and the boundary condition data stored in the storage unit 12, to thereby generate second displacement distribution data of the member (step S104). The second displacement distribution data thus include information indicating the displacement of each node of the member. Further, the processing unit 13 stores each of the generated second displacement distribution data in the storage unit 12. A commercially available application program, such as, for example, OptiStruct or Nastran, can be used for analysis of natural vibration.

Figure 5A:
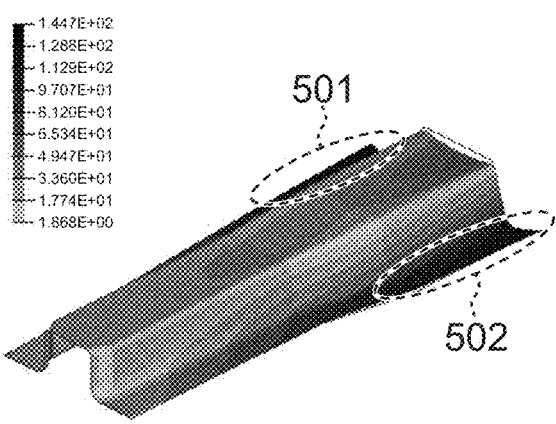
FIG. 5A is a schematic view illustrating an example of a member on which a displacement distribution based on second displacement distribution data in a second-order natural vibration mode, obtained according to an example embodiment of the present invention, is illustrated.
Figure 5B:
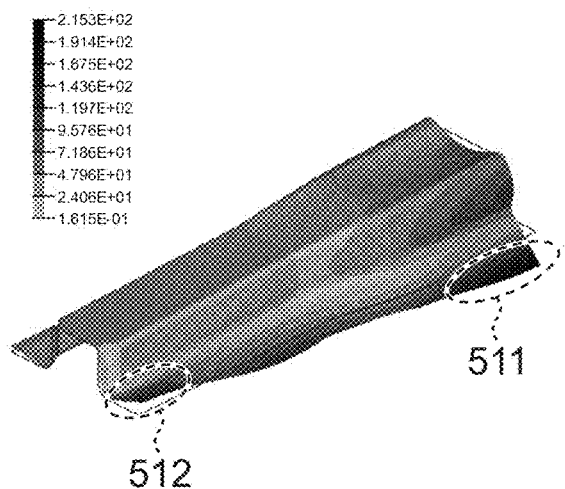
FIG. 5B is a schematic view illustrating an example of a member on which a displacement distribution based on second displacement distribution data in an eighth-order natural vibration mode, obtained according to an example embodiment of the present invention, is illustrated.
Figure 5C:
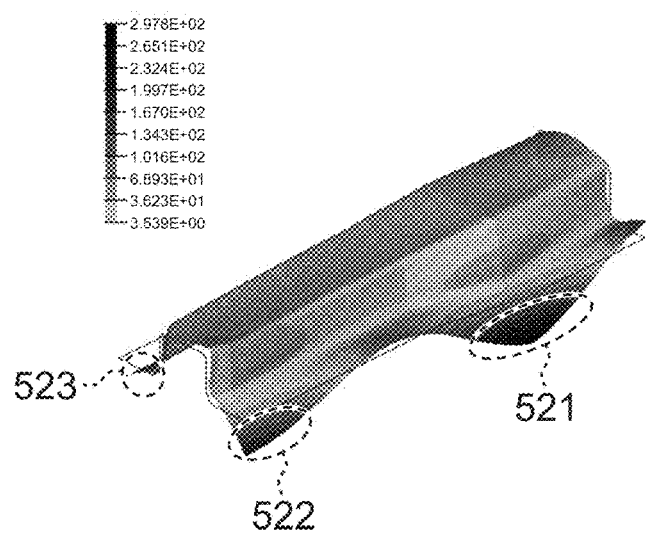
FIG. 5C is a schematic view illustrating an example of a member on which a displacement distribution based on second displacement distribution data in a twelfth-order natural vibration mode, obtained according to an example embodiment of the present invention, is illustrated.

FIGS. 5A-5C are schematic views (perspective views) illustrating an example of a member on which a displacement distribution based on the second displacement distribution data in each of a plurality of natural vibration deformation modes is illustrated. Specifically, FIG. 5A, FIG. 5B, and FIG. 5C are schematic views (perspective views) illustrating examples of members on which there are illustrated displacement distributions based on the second displacement distribution data in second-order, eighth-order, and twelfth-order natural vibration deformation modes, respectively, which are obtained by the processing unit 13. Further, in FIGS. 5A-5C, magnitudes of displacements are illustrated by shades of color, and for example, FIG. 5A illustrates displacements in the range of about 1.868 to $1.447 \times 10^2$ (dimensionless amount). For example, portions 501, 502, and so on are displaced largely in the second-order natural vibration deformation mode, portions 511, 512, and so on are displaced largely in the eighth-order natural vibration deformation mode, and portions 521 to 532, and so on are displaced largely in the twelfth-order natural vibration deformation mode.

Next, the processing unit 13 obtains a degree of coincidence of the displacement of each node of the member for each combination of "the first displacement distribution data based on displacements caused by springback and each of the second displacement distribution data in each natural vibration deformation mode" stored in the storage unit 12, to thereby obtain a degree of coincidence between the displacement distribution data (step S105). The processing unit 13 obtains, with respect to each node of the member, what degree of relevance there is between the displacement in each natural vibration deformation mode and displacement based on deformation caused by springback, to thereby obtain the degree of coincidence between the displacement distribution data. Specifically, according to an example embodiment, the processing unit 13 solves simultaneous linear equations (1) given below, to thereby obtain the degree of coincidence between the displacement distribution data. In the equations, $u_{ij}$ denotes a displacement of node j in the i-th order natural vibration deformation mode, $u_{SBj}$ denotes a displacement of node j in springback deformation, and $a_i$ denotes the degree of coincidence between the i-th order natural vibration deformation mode and the springback deformation. Note that the larger the value of $a_i$ the higher the indicated degree of coincidence between the displacement distribution data.

[Mathematical Expression 1]

$$\begin{pmatrix} u_{11} & u_{21} & \cdots & u_{i1} & \cdots & u_{m1} \\ u_{12} & u_{22} & \cdots & u_{i2} & \cdots & u_{m2} \\ \vdots & \vdots & \ddots & \vdots & & \vdots \\ u_{1j} & u_{2j} & & u_{ij} & & u_{mj} \\ \vdots & \vdots & & \vdots & \ddots & \vdots \\ u_{1n} & u_{2n} & \cdots & u_{in} & \cdots & u_{mn} \end{pmatrix} \begin{pmatrix} a_1 \\ a_2 \\ \vdots \\ a_i \\ \vdots \\ a_m \end{pmatrix} = \begin{pmatrix} u_{SB1} \\ u_{SB2} \\ \vdots \\ u_{SBj} \\ \vdots \\ u_{SBn} \end{pmatrix} \quad (1)$$

Alternatively, the processing unit 13 can also obtain the degree of coincidence between the displacement distribution data by obtaining a difference between positions after the displacement of each node of the member. Specifically, the processing unit 13 can calculate following equation (2) or equation (3), to thereby obtain the degree of coincidence between the displacement distribution data. In these equations, $b_i$ and $c_i$ denote the degrees of coincidence between the i-th order natural vibration deformation mode and the springback deformation. Note that the larger the values of $b_i$, $c_i$, the higher the indicated degree of coincidence between the displacement distribution data.

[Mathematical Expression 2]

$$b_i = \frac{1}{\sum_{j=1}^{n} |u_{ij} - u_{SBj}|} \quad (2)$$

$$c_i = \frac{1}{\sum_{j=1}^{n} (u_{ij} - u_{SBj})^2} \quad (3)$$

The processing unit 13 stores each of the obtained degrees of coincidence between the displacement distribution data in the storage unit 12. Note that in the following description, explanations are given taking an example of the case where $a_i$ is used for representing the degrees of coincidence between the i-th order natural vibration deformation mode and the springback deformation.

Next, the processing unit 13 selects one or more (a small number of) natural vibration deformation modes based on each of the degrees of coincidence between the displacement distribution data stored in the storage unit 12 (step S106). The processing unit 13 selects a predetermined number (three for example) of natural vibration deformation modes in order in order of degree of coincidence, beginning with the natural vibration deformation mode in which the degree of coincidence between the displacement distribution data is largest. Alternatively or additionally, the selection by the processing unit 13 is of one or more natural vibration deformation modes in which the degree of coincidence between the displacement distribution data satisfies a condition that the degree of coincidence is at least equal to or is larger than a predetermined threshold. Thus, the processing unit 13 selects natural vibration deformation modes based on the degree of coincidence between the displacement distribution data. Accordingly, although a small number of natural vibration deformation modes are selected, the probability of selecting the natural vibration deformation mode corresponding to the deformation of the member caused by springback increases. The processing unit 13 then stores the orders of the selected natural vibration deformation modes in the storage unit 12.

Next, the processing unit 13 generates a combination of modes which simultaneously increase the natural frequency out of the natural vibration deformation modes of the orders stored in the storage unit 12. The processing unit 13 accumulates the natural vibration deformation modes one by one in order from the natural vibration deformation mode in which the degree of coincidence between the displacement distribution data is largest, to thereby generate n combinations (for example, {eighth order}, {eighth order, second order}, and {eighth order, second order, twelfth order}) from m natural vibration deformation modes (for example, eighth order, second order, and twelfth order) (m and n are integers of one or more, which may either be the same numbers or different numbers). For example, a predetermined 'm' number of vibration modes of highest coincidences are selected, and a predetermined 'n' number of combinations, for example, of certain types are selected, e.g., a first "combination" including only the vibration mode with the highest degree of coincidence, and a second combination of all of the 'm' selected vibration modes.

According to an alternative example embodiment, the processing unit 13 accumulates the natural vibration deformation modes two by two in order from the natural vibration deformation mode in which the degree of coincidence between the displacement distribution data is largest. Further, with respect to each generated combination of the natural vibration deformation modes, the processing unit 13 disposes beads in the finite element model data stored in the storage unit 12 so that at least one of the natural frequencies of the natural vibration deformation modes included in this combination increases based on the material physical property data, the boundary condition data, and disposition condition data stored in the storage unit 12 (step S107).

Here, disposing beads in the finite element model data means forming concaves and convexes in the surface of the member belonging to an element included in the finite element model data. The beads in the present invention thus mean forming concaves and convexes in the surface of the member and are a concept which also includes embossment or the like. Further, when there are plural natural vibration deformation modes included in the combination, it is preferred to increase all the natural frequencies of the plural natural vibration deformation modes. However, this may not be possible depending on the natural vibration deformation mode included in this combination. In such cases, therefore, at least one of the natural frequencies of the plural natural vibration deformation modes is increased.

The processing unit 13 then stores in the storage unit 12 each of the finite element model data after beads are disposed. The commercially available application program, OptiStruct, for example, can be used for disposing processing of beads. Further, when disposing processing of beads is performed, the ratio of a bead disposing area to a member area can be specified. Here, the member area is the area of a surface where beads can be disposed in the surface of the member. The bead disposing area is the area of a portion where beads are disposed in the surface of the member. When this ratio is large, beads are disposed in the region of a large portion of the member. However, the region where beads are disposed may be limited depending on the shape of the member, member attaching position, a relation with other members, and so on. Further, there may be cases where only a region which contributes largely to suppression of deformation of the member caused by springback is desired to be the region where beads are disposed, so as to facilitate designing of the member. In this viewpoint, the user appropriately specifies the ratio of the bead disposing area to the member area by operating an operating unit 14.

Figure 6A:
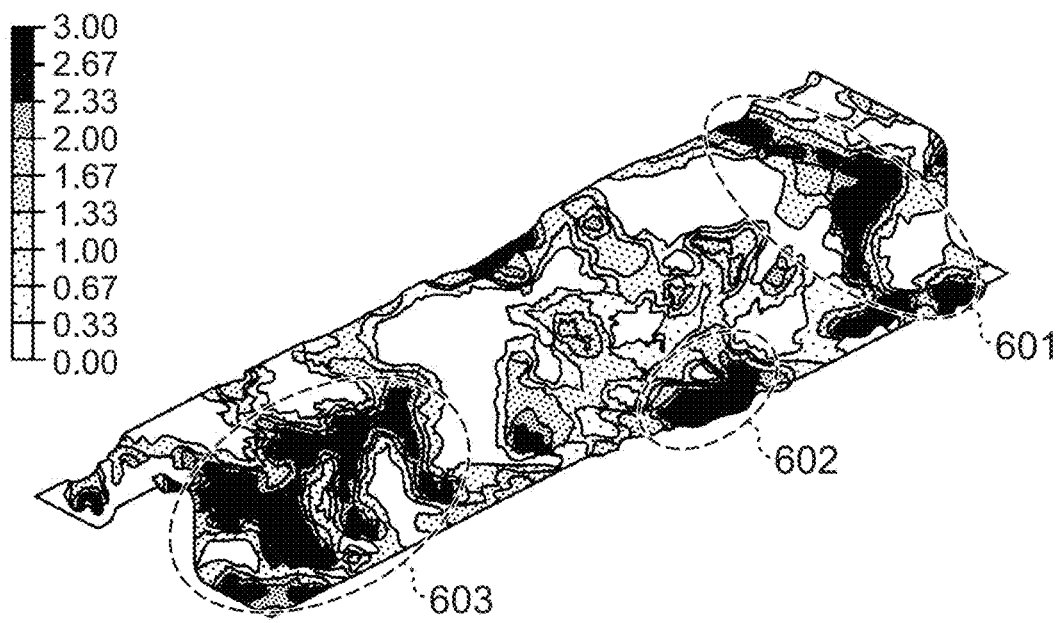
FIG. 6A is a schematic view illustrating an example of a disposition of beads obtained with respect to a natural vibration deformation mode of the eighth order, according to an example embodiment of the present invention.
Figure 6B:
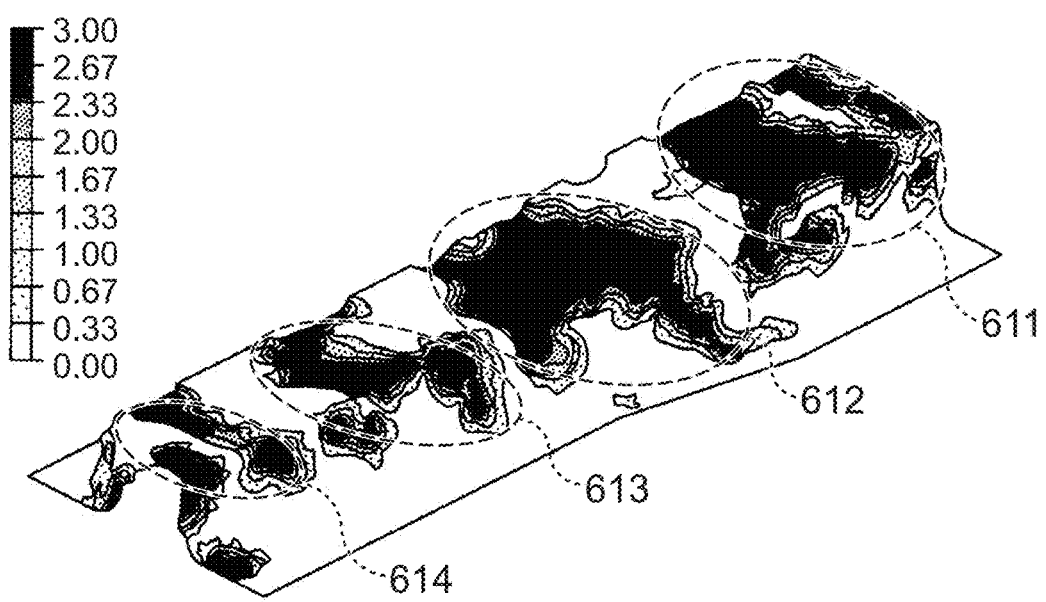
FIG. 6B is a schematic view illustrating an example of a disposition of beads obtained with respect to a combination of natural vibration deformation modes of the eighth order, second order, and twelfth order, according to an example embodiment of the present invention.

FIGS. 6A-6B are schematic views (perspective views) illustrating examples of dispositions of beads obtained by the processing unit 13 with respect to each combination of the natural vibration deformation modes. Specifically, FIGS. 6A-6B are schematic views (perspective views) illustrating dispositions of beads obtained by the processing unit 13 with respect to the combinations of the natural vibration deformation modes of {eighth order} and {eighth order, second order, twelfth order}, respectively. In FIGS. 6A-6B, heights of beads are illustrated by shades of color, and the heights of beads in the range of about 0.00 mm to 3.00 mm are illustrated. For example, high beads are disposed (large concaves are added) in portions 601 to 603, and so on for {eighth order}, and in portions 611 to 614, and so on for {eighth order, second order, twelfth order}.

Next, the processing unit 13 obtains a stress which occurs in each element of the member by the finite element method based on "each finite element model data, the material physical property data, and the press forming condition data after beads are disposed" stored in the storage unit 12, to thereby update the stress distribution data of the member (step S108). Further, the processing unit 13 stores the thus generated "stress distribution data after beads are disposed" in the storage unit 12. Note that a commercially available application program, such as for example, HyperForm, LS-DYNA or PAM-STAMP, can be used for analysis of press forming.

Next, regarding "each finite element model data after beads are disposed" stored in the storage unit 12, the processing unit 13 maps the "stress distribution data after update" stored in the storage unit 12 on this finite element model data (step S109). The processing unit 13 then obtains the displacement of each node of the member by the finite element method based on the finite element model data on which the stress distribution data after update are mapped and the "material physical property data and boundary condition data" stored in the storage unit 12, to thereby generate the first displacement distribution data of the member (step S109). Further, the processing unit 13 stores the thus generated "first displacement distribution data after beads are disposed" in the storage unit 12. A commercially available application program, such as for example LS-DYNA or PAM-STAMP, can be used for springback analysis.

Next, the processing unit 13 determines whether a difference between the shape of the member determined based on the first displacement distribution data after beads are disposed and a target shape of this member is in a predetermined range or not (step S110). This determination can be realized by, for example, determining whether or not all differences between plural positions after displacement of the node of each element and positions of the target shape corresponding to the positions are in a predetermined range.

As a result of this determination, when the difference between the shape of the member determined based on the first displacement distribution data after beads are disposed and the target shape of this member is not in the predetermined range, the process proceeds to step S104. Then, the processing of steps S104 to S110 is performed repeatedly using "each (latest) finite element model data after beads are disposed" stored in the storage unit 12 until the difference between the shape of the member determined based on the first displacement distribution data after beads are disposed and the target shape of this member comes in the predetermined range. Then, when the difference between the shape of the member determined based on the first displacement distribution data after beads are disposed and the target shape of this member comes in the predetermined range, the processing unit 13 displays information or the like identifying the disposition of beads (the latest disposition of beads obtained in step S107) which makes the difference between the shape of the member after springback and the target shape to be in a predetermined range on a display unit 15. For example, information identifying the disposition of beads illustrated in FIG. 6B is displayed. Then, the processing of the flowchart of FIG. 1 is finished. Other information identifying the disposition of beads, besides for the image illustrated in FIG. 6B, can include, for example, information of dispositions, shapes, heights (depths), and so on of beads. Further, information indicating the natural vibration deformation mode (the latest natural vibration deformation mode obtained in step S106) selected when the difference between the shape of the member after springback and the target shape to be in the predetermined range may be displayed on the display unit 15.

Figure 7A:
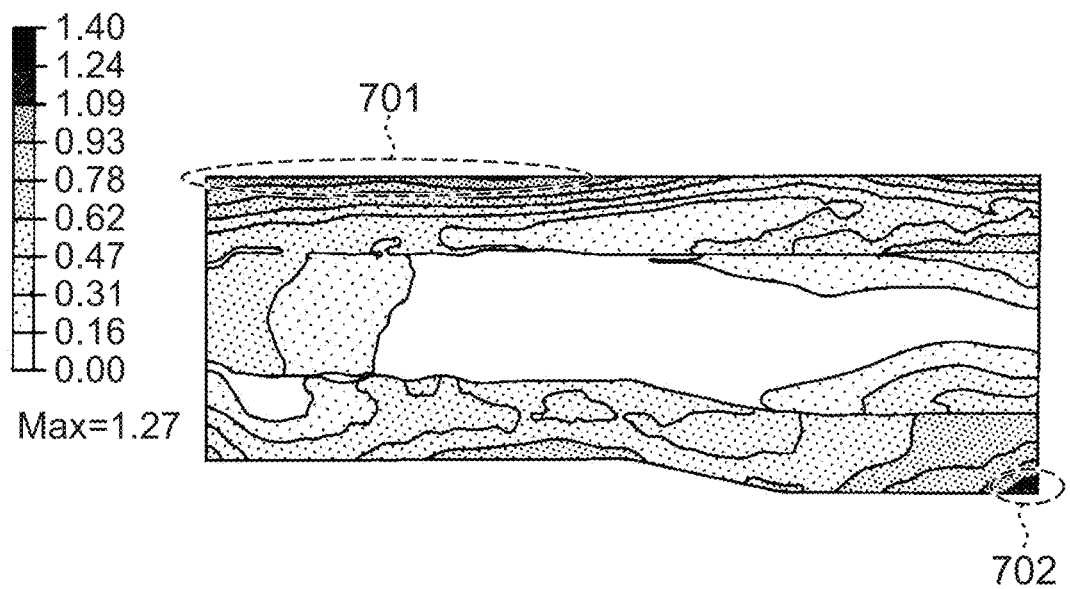
FIG. 7A is a schematic view illustrating an example of a displacement distribution of the member after the disposition of beads obtained with respect to the natural vibration deformation mode of the eighth order is performed, according to an example embodiment of the present invention.
Figure 7B:
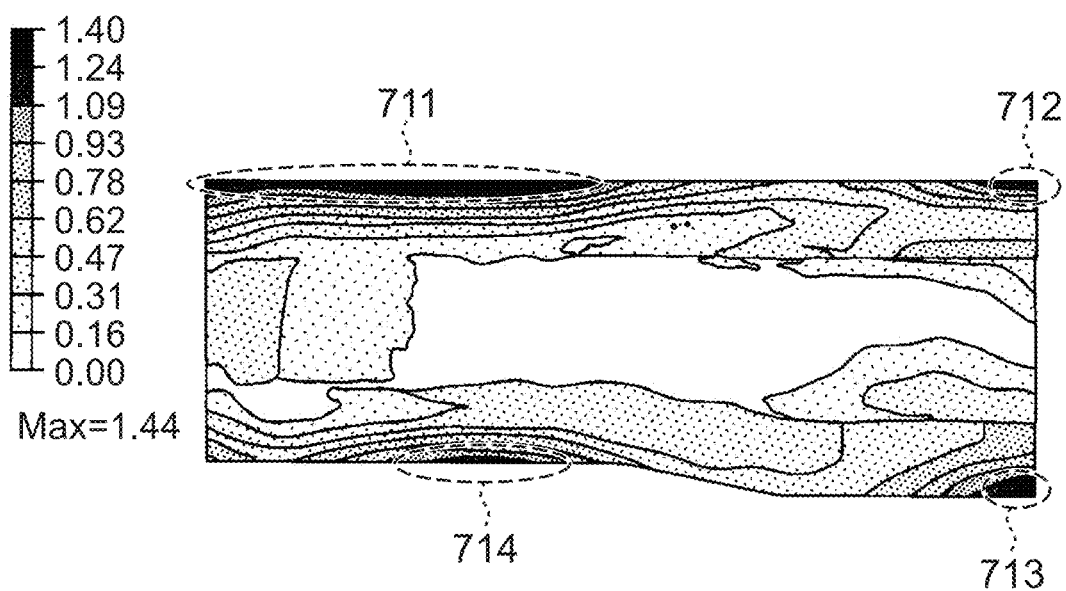
FIG. 7B is a schematic view illustrating an example of a displacement distribution of the member after the disposition of beads obtained with respect to the combination of natural vibration deformation modes of the eighth order, second order, and twelfth order is performed, according to an example embodiment of the present invention.

FIGS. 7A-7B are schematic views (perspective views) illustrating examples of displacement distributions of the member after the disposition of beads obtained by the processing unit 13 with respect to each combination of the natural vibration deformation modes is performed. Specifically, FIGS. 7A-7B are schematic views (perspective views) illustrating displacement distributions of the member after the dispositions of beads obtained by the processing unit 13 is performed with respect to the combinations of the natural vibration modes of {eighth order} and {eighth order, second order, twelfth order}, respectively. Further, in FIG. 7A and FIG. 7B, magnitudes of displacements are illustrated by shades of color, and displacements in the range of about 0.00 mm to 1.40 mm are illustrated. For example, portions 701, 702, and so on are displaced largely for {eighth order} and portions 711 to 714, and so on are displaced largely for {eighth order, second order, twelfth order}. Regarding the magnitudes of displacements, a displacement up to 1.27 mm occurs for the former order, and a displacement up to 1.44 mm occurs for the latter orders (see "Max=1.27" of FIG. 7A and "Max=1.44" of FIG. 7B).

On the other hand, the maximum values of natural frequencies increase in the order of FIG. 4, FIG. 7B, and FIG. 7A, and correspond to the maximum values of displacements. Therefore, when a natural frequency is obtained with respect to each candidate of bead disposition of combinations of plural natural vibration modes, and the bead disposition of the combination of natural vibration modes which causes the maximum values of natural frequencies to be maximum is selected, displacements of the member can be reduced largely.

Figure 8:
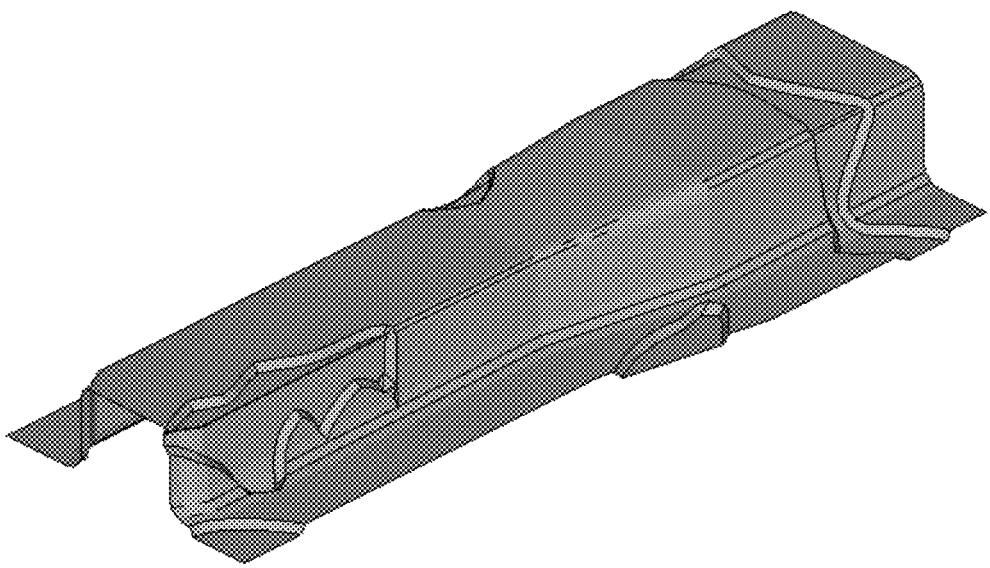
FIG. 8 is a schematic view illustrating examples of actual dispositions of beads with respect to the member, according to an example embodiment of the present invention.

As described above, in the processing of step S111, for example, the information identifying the disposition of beads illustrated in FIG. 6B is displayed. However, the shapes of beads illustrated in FIG. 6B are complicated. Therefore, it is uneasy to dispose beads on the member as illustrated in FIG. 6B. Accordingly, the user determines an actual disposition of beads (that is, the shape of the member) for the member based on the disposition of beads illustrated in FIG. 6B and the shape, attaching position, and relation with other members, and the like of the member. FIG. 8 is a schematic view (perspective view) illustrating examples of actual dispositions of beads with respect to the member, which a user can determine from the disposition of beads illustrated in FIG. 6B.

Thus, the processing unit 13 of the analyzing apparatus 1 executes a press forming analysis, a springback analysis, a natural vibration analysis, and/or the like with respect to the finite element model data. Further, the processing unit 13 selects a small number of natural vibration deformation modes based on the degree of coincidence with springback deformation, and disposes beads in the finite element model data so that regarding each combination of them, the natural frequency of the natural vibration deformation modes included in this combination increases. Then, the processing unit 13 executes the press forming analysis and springback analysis again for the finite element model data after the beads are disposed. The disposition of beads, press forming analysis, and springback analysis are then performed repeatedly until the difference between the shape of the member after the springback analysis and the target shape comes within a predetermined range. Thus, the user is able to easily select the natural vibration deformation mode corresponding to the springback deformation.

Note that in the flowchart of FIG. 1, the processing of steps S108, S110 may be omitted. In such cases, in step S109, for "each finite element model data after beads are disposed" stored in the storage unit 12, the "stress distribution data of the member" generated in step S102 and stored in the storage unit 12 are mapped.

Figure 9:
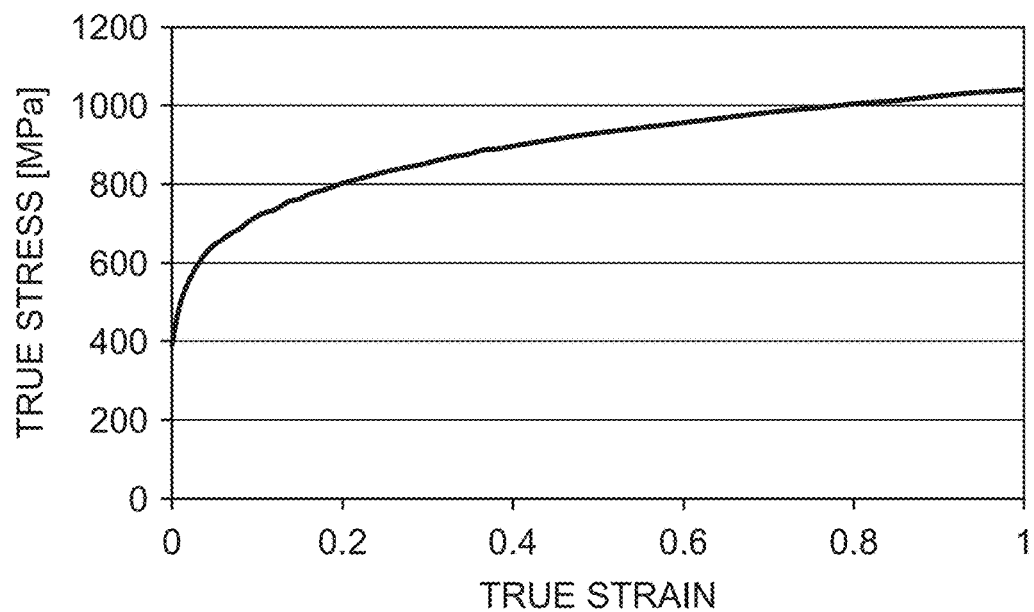
FIG. 9 is a chart illustrating an example of a relation between strain and stress in a plastic deformation region of a member with respect to which application of a method according to an example embodiment of the present is described.

Next, an example of this embodiment will be described. In this example, a member of a shape illustrated in FIGS. 2A-2B, namely, a hat shape, was employed as a target of analysis. As dimensions of the member, a length of 300 mm, a cross-section of 58 mm×36 mm to 46 mm×26 mm, and a flange width of 26 mm were set. The sheet thickness of the member was 1.2 mm. Further, the material forming the member was a steel sheet. As physical properties of the steel sheet, Young's modulus of 206 GPa, Poisson's ratio of 0.3, and specific gravity of 7.8 were set. Further, a relation between strain and stress in a plastic deformation region was set as illustrated in FIG. 9. Moreover, a friction coefficient of the steel sheet was 0.12.

Figure 10:
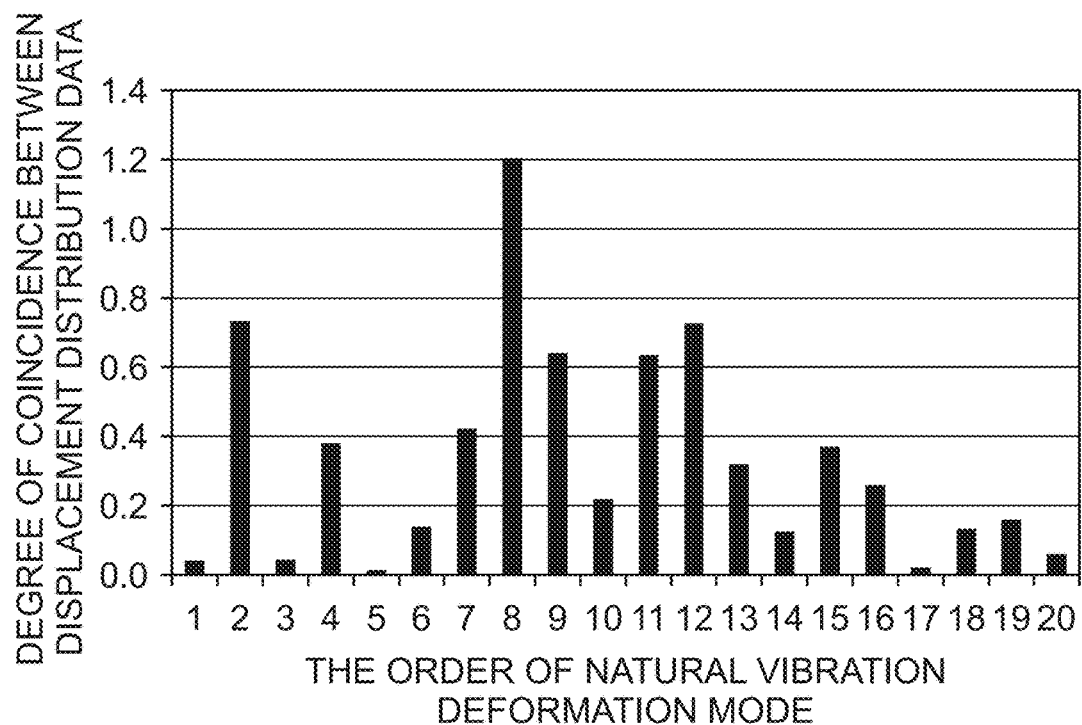
FIG. 10 is a chart illustrating an example of a relation between the orders of the natural vibration deformation modes and the degrees of coincidence, analyzed according to an example embodiment of the present invention.

The press forming analysis, springback analysis, natural vibration analysis, and mode decomposition were executed under the above-described conditions, and then a relation between the order of the natural vibration deformation mode and the degree of coincidence between the displacement distribution data was obtained as illustrated in FIG. 10. Here, the horizontal axis illustrates the order of the natural vibration deformation mode. The vertical axis illustrates the degree of coincidence between the displacement distribution data (between the first displacement distribution data based on springback deformation and the second displacement distribution data in each natural vibration deformation mode). From this relation, it can be seen that the degree of coincidence between the displacement distribution data is large in the order of eighth order, second order, twelfth order, ninth order, and eleventh order.

Accordingly, the eighth-order, second-order, and twelfth-order natural vibration deformation modes were selected, {eighth order} and {eighth order, second order, twelfth order} were selected as combinations for simultaneous increase of their natural frequencies, the upper limit of heights of beads was set to 3 mm, and the upper limit of the ratio of bead disposition areas was set in a first case to 100% of the member area and in a second case to 30% of the member area.

A disposition of beads and springback analysis were executed under the above-described conditions, and natural vibration frequencies and maximum displacements of the member in the natural vibration deformation modes were obtained as illustrated in Table 1.

TABLE 1

| Condition | | Before disposition of beads | Mode = {eighth order} Upper limit = 100% | Mode = {eighth order, second order, twelfth order} Upper limit = 100% | Mode = {eighth order} Upper limit = 30% | Mode = {eighth order, second order, twelfth order} Upper limit = 30% |
|---|---|---|---|---|---|---|
| Natural vibration frequency [Hz] | Second order | 244.4 | — | 409.7 | — | 424.1 |
| | Eighth order | 1202.2 | 1736.1 | 1481.6 | 2908.1 | 1407.4 |
| | Twelfth order | 1398.7 | — | 1619.8 | — | 1580.5 |
| Maximum displacement [mm] | | 1.45 | 1.35 | 1.48 | 1.27 | 1.44 |

From Table 1, it can be seen that when beads are disposed with 30% of the member area being the upper limit in the eighth-order natural vibration deformation mode, the maximum value of the natural frequency becomes largest, and the maximum displacement of the member decreases from 1.45 mm to 1.27 mm, which is improved by 12.4%. Further, when beads are disposed with 30% of the member area being the upper limit here, the beads can be disposed only in a region which contributes largely to suppression of deformation of the member caused by springback. When beads are disposed thus with 30% of the member area being the upper limit, the maximum displacement of the member becomes small as the maximum value of natural frequencies becomes large.

Finally, a hardware structure of the analyzing apparatus 1 in this embodiment will be described. FIG. 11 is a block diagram illustrating an example of a functional structure of the analyzing apparatus 1. The analyzing apparatus 1 executes an already-installed program, refers to data stored in the storage unit 12 and/or data stored in other devices, and executes various processing. Further, the analyzing apparatus 1 executes various processing according to an instruction inputted by the user via the operating unit 14, and presents the results thereof to the user via the display unit 15. For this purpose, the analyzing apparatus 1 includes a communication unit 11, the storage unit 12, the processing unit 13, the operating unit 14, and the display unit 15.

The communication unit 11 includes a communication interface circuit for connecting the analyzing apparatus 1 to a not-illustrated network. The communication unit 11 gives data received via the network from another not-illustrated apparatus to the processing unit 13. Further, the communication unit 11 transmits data received from the processing unit 13 to another apparatus via the network.

The storage unit 12 includes, for example, a semiconductor memory, a magnetic disk device, and/or an optical disk device. The storage unit 12 stores application programs, data, and so on used for processing in the processing unit 13. The storage unit 12 stores, as application programs for example, a finite element model generating program, a press forming analyzing program, a springback analyzing program, a natural vibration analyzing program, a mode decomposition program, a mode selecting program, a bead disposition program, and the like.

Further, in an example embodiment, the storage unit 12 stores the following data and the like as initial set data which are set in advance. As first initial set data, the storage unit 12 stores CAD (Computer Aided Design) model data indicating the position, the size, and the shape of the member. As second initial set data, the storage unit 12 stores the material physical property data indicating material physical properties (dimension, sheet thickness, material, Young's modulus, Poisson's ratio, mass density, relation between stress and strain, and so on) of the member. As third initial set data, the storage unit 12 stores the generation condition data indicating generation conditions (shape, size, and so on of elements) of the finite element model. As fourth initial set data, the storage unit 12 stores the press forming condition data indicating press forming conditions (friction coefficient, member flange pressing force, and so on). As fifth initial set data, the storage unit 12 stores the boundary condition data indicating boundary conditions (fixed point and the like on a member). As sixth initial set data, the storage unit 12 stores the disposition condition data and so on indicating disposition conditions of beads (height, disposing area, and so on).

Further, the storage unit 12 stores the following data and the like as intermediate data generated by the processing unit 13. Specifically, as first intermediate data, the storage unit 12 stores the finite element model data (position, shape, size, and so on of elements) corresponding to the CAD model data. As second intermediate data, the storage unit 12 stores the stress distribution data indicating a stress distribution of the member. As third intermediate data, the storage unit 12 stores the first displacement distribution data indicating a displacement distribution of the member caused by springback. As fourth intermediate data, the storage unit 12 stores the second displacement distribution data indicating a displacement distribution of the member in each natural vibration deformation mode. As fifth intermediate data, the storage unit 12 stores the degree of coincidence between the displacement distribution data. As sixth intermediate data, the storage unit 12 stores the selected orders of the natural vibration deformation modes. As seventh intermediate data, the storage unit 12 stores the finite element model data after beads are disposed. As eighth intermediate data, the storage unit 12 stores displacement distribution data indicating a displacement distribution after beads are disposed. Moreover, the storage unit 12 may temporarily store temporary data related to predetermined processing.

The processing unit 13 includes one or more processors and a peripheral circuit thereof. The processing unit 13 is a processing unit, for example a CPU (Central Processing Unit), which performs overall control of the entire operation of the analyzing apparatus 1. Specifically, the processing unit 13 controls operation of the communication unit 11, the display unit 15, and so on so that various processing of the analyzing apparatus 1 is executed in an appropriate procedure based on operations of the operating unit 14, programs stored in the storage unit 12, and the like. The processing unit 13 executes processing based on programs (operating system program, application program, and so on) stored in the storage unit 12. Further, the processing unit 13 is able to execute plural programs (application programs, and the like) in parallel.

The processing unit 13 includes a finite element model generating unit 131 which executes the processing of step S101 in FIG. 1, a press forming analyzing unit 132 which executes the processing of steps S102 and S108, a springback analyzing unit 133 which executes the processing of steps S103 and S109, a natural vibration analyzing unit 134 which executes the processing of step S104, a mode decomposing unit 135 which executes the processing of step S105, a mode selecting unit 136 which executes the processing of step S106, a bead disposing unit 137 which executes the processing of step S107, a shape judging unit 138 which executes the processing of step S110, and a data drawing unit 139 which executes the processing of step S111. The respective units which the processing unit 13 includes are functional modules mounted by programs executed on a processor which the processing unit 13 includes. Alternatively, the respective units which the processing unit 13 includes may be mounted in the analyzing apparatus 1 as firmware.

The data drawing unit 139 executes drawing processing of data. Specifically, this unit analyzes data given by the finite element model generating unit 131, the press forming analyzing unit 132, the springback analyzing unit 133, the natural vibration analyzing unit 134, the mode decomposing unit 135, the mode selecting unit 136, and the bead disposing unit 137, renders these data in a predetermined format (for example, a contour diagram), and generates drawing data thereof. Then, the data drawing unit 139 outputs the generated drawing data to the display unit 15 and/or the like. In such cases, the display unit 15 functions as an output unit. However, it is not always necessary to do so. For example, the communication unit 11 functions as an output unit when the communication unit 11 transmits data given by the finite element model generating unit 131, the press forming analyzing unit 132, the springback analyzing unit 133, the natural vibration analyzing unit 134, the mode decomposing unit 135, the mode selecting unit 136, and the bead disposing unit 137 to an external device.

The operating unit 14 may be any device as long as it allows to operate the analyzing apparatus 1, for example, a keyboard, a touch panel, and/or the like. The user can use this device to input an instruction of selection or the like. When operated by the user, the operating unit 14 generates a signal corresponding to this operation. The generated signal is then inputted to the processing unit 13 as an instruction from the user.

The display unit 15 may be any device as long as it is capable of displaying a video, an image, and the like, and is a liquid crystal display, an organic EL (electro-luminescence) display, or the like for example. The display unit 15 displays a video, an image, and/or the like corresponding to the drawing data supplied from the processing unit 13.

As has been described, in this embodiment, based on the degree of coincidence between the first displacement distribution data of the member caused by springback and each of the second displacement distribution data of the member in each natural vibration deformation mode, a small number of natural vibration deformation modes are selected including the natural vibration deformation mode corresponding to deformation of the member caused by springback. This enables the user to easily select the natural vibration deformation mode corresponding to the deformation of the member caused by springback. Thus, an analysis for reducing deformation of a member caused by springback can be performed easily.

The present invention is not limited to the specific embodiments described above with respect to the figures. For example, although the analyzing apparatus 1 includes the respective units illustrated in FIG. 11 in this embodiment, part of the units may be included in a not-illustrated server apparatus. The server apparatus may include, for example, a storage unit equivalent to the storage unit 12 of the analyzing apparatus 1 and provide programs, data, and so on stored in the storage unit to the analyzing apparatus 1, allowing the analyzing apparatus 1 to execute the analyzing processing. In such cases, the processing unit 13 of the analyzing apparatus 1 obtains programs, data, and the like from the server apparatus via the communication unit 11. On the other hand, when programs, data, and the like are stored in the storage unit 12 of the analyzing apparatus 1, the processing unit 13 obtains the program, data, and the like from the storage unit 12. Further, the server apparatus may include a storage unit and a processing unit equivalent to the storage unit 12 and the processing unit 13 of the analyzing apparatus 1, execute the analyzing processing of the programs, data, and the like stored in the storage unit, and provide only results thereof to the analyzing apparatus 1.

Further, a program, for causing a computer to realize respective functions described above with respect to the processing unit 13 of the analyzing apparatus 1, may be recorded in a computer readable recording medium such as, for example, a magnetic recording medium or an optical recording medium.

Specifically, the above-described embodiments of the present invention can be realized by a computer executing a program. Further, means for supplying the program to the computer, for example a computer readable recording medium such as a CD-ROM or the like recording such a program, or a transmission medium which transmits such a program can be applied as an embodiment of the present invention. Further, a computer program product such as a computer readable recording medium recording the program can be applied as an embodiment of the present invention. The above-described program, computer readable recording medium, transmission medium, and program product are included in the scope of the present invention. Further, all of the above-described embodiments of the present invention merely illustrate concrete examples of implementing the present invention, and the technical scope of the present invention is not to be construed in a restrictive manner by these embodiments. That is, the present invention may be implemented in various forms without departing from the technical spirit or main features thereof.

The present invention can be used for forming a member applied to, for example, the body of an automobile, and the like.

The invention claimed is:

1. An analyzing system configured to output information for member shape modification for reducing deformation of a member formed by a press forming process at a position of the member, the deformation caused by springback, the analyzing apparatus system comprising:
a computer processor configured to:
obtain finite element model data for a finite element model indicating a shape of the member, material physical property data indicating material physical properties of the member, and stress distribution data indicating a stress distribution which occurs in the member; execute a finite element method to determine:
a displacement of nodes of the finite element model data caused by springback, the determination being based on (a) the finite element model data, (b) the material physical property data, and (c) the stress distribution data, thereby generating first displacement distribution data indicating a displacement distribution of the member caused by the springback; and
a displacement of nodes of the finite element model data with respect to each of a plurality of natural vibration deformation modes based on (a) the finite element model data and (b) the material physical property data, thereby generating respective second displacement distribution data, each indicating a respective displacement distribution of the member for a respective one of the plurality of natural vibration deformation modes;
determine a degree of coincidence between the first displacement distribution data and each of the second displacement distribution data, the degree of coincidence indicating degree of relevance between displacement in each natural vibration deformation mode and displacement based on deformation caused by springback;
select, for candidate modifications, one or more of the natural vibration deformation modes based on the respective degrees of coincidence; and
determine a disposition of one or more beads in the finite element model data for increasing a natural frequency of at least a portion of the one or more natural vibration deformation modes, the disposition of the beads being such that, if applied, the disposition modifies the shape of the member,
a bead comprising of concaves and convexes on the surface is formed at a position of the member, the position determined based on results of a finite element analysis of the model of the member.

2. The analyzing system according to claim 1, wherein the selection is of a predetermined number of natural vibration deformation modes in order of the respective degrees of coincidence, beginning from the natural vibration deformation mode in which the degree of coincidence is largest.

3. The analyzing system according to claim 1, wherein the selection is performed such that only those of the natural vibration deformation modes for which the respective degree of coincidence is larger than a predetermined threshold are selected.

4. The analyzing system according to claim 1, wherein the degree of coincidence is determined by equation (1), equation (2), or equation (3):

$$\begin{pmatrix} u_{11} & u_{21} & \cdots & u_{i1} & \cdots & u_{m1} \\ u_{12} & u_{22} & \cdots & u_{i2} & \cdots & u_{m2} \\ \vdots & \vdots & \ddots & \vdots & & \vdots \\ u_{1j} & u_{2j} & & u_{ij} & & u_{mj} \\ \vdots & \vdots & & \vdots & \ddots & \vdots \\ u_{1n} & u_{2n} & \cdots & u_{in} & \cdots & u_{mn} \end{pmatrix} \begin{pmatrix} a_1 \\ a_2 \\ \vdots \\ a_i \\ \vdots \\ a_m \end{pmatrix} = \begin{pmatrix} u_{SB1} \\ u_{SB2} \\ \vdots \\ u_{SBj} \\ \vdots \\ u_{SBn} \end{pmatrix} \quad (1)$$

$$b_i = \frac{1}{\sum_{j=1}^{n} |u_{ij} - u_{SBj}|} \quad (2)$$

$$c_i = \frac{1}{\sum_{j=1}^{n} (u_{ij} - u_{SBj})^2} \quad (3)$$

wherein $u_{ij}$ denotes a displacement of a node j in an i-th order natural vibration deformation mode, $u_{SBj}$ denotes a displacement of node j in springback deformation, and $a_i$, $b_i$, and $c_i$, denote the degree of coincidence between the i-th order natural vibration deformation mode and the springback deformation.

5. A computer-implemented method for reducing deformation of a member formed by a press forming process at a position of the member, the deformation caused by springback, the method comprising:
(a) obtaining, by a computer processor, finite element model data for a finite element model indicating a shape of the member, material physical property data indicating material physical properties of the member, and stress distribution data indicating a stress distribution which occurs in the member;
(b) executing, by the processor, a finite element method to determine:
(i) a displacement of nodes of the finite element model data caused by springback, the determination being based on (a) the finite element model data, (b) the material physical property data, and (c) the stress distribution data, thereby generating first displacement distribution data indicating a displacement distribution of the member caused by the springback;
(ii) a displacement of nodes of the finite element model data with respect to each of a plurality of natural vibration deformation modes based on (a) the finite element model data and (b) the material physical property data, thereby generating respective second displacement distribution data, each indicating a respective displacement
distribution of the member for a respective one of the plurality of natural vibration deformation modes;
(c) determining, by the processor, a degree of coincidence between the first displacement distribution data and each of the second displacement distribution data, the degree of coincidence indicating degree of relevance between displacement in each natural vibration deformation mode and displacement based on deformation caused by springback;
(d) selecting, by the processor for candidate modifications, one or more of the natural vibration deformation modes based on the respective degrees of coincidence; and
(e) determining a disposition of one or more beads in the finite element model data for increasing a natural frequency of at least a portion of the one or more natural vibration deformation modes, the disposition of the beads being such that, if applied, the disposition modifies the shape of the member; and
forming a bead comprising of concaves and convexes on the surface at a position of the member, the position determined based on results of a finite element analysis of the model of the member.

6. The method according to claim 5, further comprising:
(f) re-performing step (b)(i) incorporating the bead distribution determined in step (e) into the finite element model data to obtain a new shape;
(g) comparing the new shape to a target shape; and
(h) executing instructions that cause the processor to:
if a difference between the new shape and the target shape determined in step (g) is greater that a threshold difference, re-perform steps (b)(ii)-(h); and
if the difference between the new shape and the target shape determined in step (g) is not greater than the threshold difference, output a representation of the member with the bead distribution of the last execution of step (e).

7. The method according to claim 5, further comprising: outputting a representation of the member with the bead distribution.

8. The method according to claim 5, wherein the selection is of a predetermined number of natural vibration deformation modes in order of the respective degrees of coincidence, beginning from the natural vibration deformation mode in which the degree of coincidence is largest.

9. The method according to claim 5, wherein the selection is performed such that only those of the natural vibration deformation modes for which the respective degree of coincidence is larger than a predetermined threshold are selected.

10. The computer-implemented method according to claim 5, wherein the degree of coincidence is determined by equation (1), equation (2), or equation (3):

$$\begin{pmatrix} u_{11} & u_{21} & \cdots & u_{i1} & \cdots & u_{m1} \\ u_{12} & u_{22} & \cdots & u_{i2} & \cdots & u_{m2} \\ \vdots & \vdots & \ddots & \vdots & & \vdots \\ u_{1j} & u_{2j} & & u_{ij} & & u_{mj} \\ \vdots & \vdots & & \vdots & \ddots & \vdots \\ u_{1n} & u_{2n} & \cdots & u_{in} & \cdots & u_{mn} \end{pmatrix} \begin{pmatrix} a_1 \\ a_2 \\ \vdots \\ a_i \\ \vdots \\ a_m \end{pmatrix} = \begin{pmatrix} u_{SB1} \\ u_{SB2} \\ \vdots \\ u_{SBj} \\ \vdots \\ u_{SBn} \end{pmatrix} \quad (1)$$

$$b_i = \frac{1}{\sum_{j=1}^{n} |u_{ij} - u_{SBj}|} \quad (2)$$

$$c_i = \frac{1}{\sum_{j=1}^{n} (u_{ij} - u_{SBj})^2} \quad (3)$$

wherein $u_{ij}$ denotes a displacement of a node j in an i-th order natural vibration deformation mode, $u_{SBj}$ denotes a displacement of node j in springback deformation, and $a_i$, $b_i$, and $c_i$, denote the degree of coincidence between the i-th order natural vibration deformation mode and the springback deformation.

11. A non-transitory computer-readable medium on which are stored instructions that are executable by a computer processor, the instructions which, when executed by the processor, cause the processor to perform a method for reducing deformation of a member formed by a press forming process at a position caused by springback, the method comprising:

obtaining finite element model data for a finite element model indicating a shape of the member, material physical property data indicating material physical properties of the member, and stress distribution data indicating a stress distribution which occurs in the member; executing a finite element method to determine:

a displacement of nodes of the finite element model data caused by springback, the determination being based on (a) the finite element model data, (b) the material physical property data, and (c) the stress distribution data, thereby generating first displacement distribution data indicating a displacement distribution of the member caused by the springback;

a displacement of nodes of the finite element model data with respect to each of a plurality of natural vibration deformation modes based on (a) the finite element model data and (b) the material physical property data, thereby generating respective second displacement distribution data, each indicating a respective displacement distribution of the member for a respective one of the plurality of natural vibration deformation modes; determining a degree of coincidence between the first displacement distribution data and each of the second displacement distribution data, the degree of coincidence indicating degree of relevance between displacement in each natural vibration deformation mode and displacement based on deformation caused by springback; and selecting one or more of the natural vibration deformation modes based on the respective degrees of coincidence; and determining a disposition of one or more beads in the finite element model data for increasing a natural frequency of at least a portion of the one or more natural vibration deformation modes, the disposition of the beads being such that, if applied, the disposition modifies the shape of the member: and forming a bead comprising of concaves and convexes on the surface at a position of the member, the position determined based on results of a finite element analysis of the model of the member.

12. The non-transitory computer-readable medium according to claim 11, wherein the degree of coincidence is determined by equation (1), equation (2), or equation (3):

$$\begin{pmatrix} u_{11} & u_{21} & \cdots & u_{i1} & \cdots & u_{m1} \\ u_{12} & u_{22} & \cdots & u_{i2} & \cdots & u_{m2} \\ \vdots & \vdots & \ddots & \vdots & & \vdots \\ u_{1j} & u_{2j} & & u_{ij} & & u_{mj} \\ \vdots & \vdots & & \vdots & \ddots & \vdots \\ u_{1n} & u_{2n} & \cdots & u_{in} & \cdots & u_{mn} \end{pmatrix} \begin{pmatrix} a_1 \\ a_2 \\ \vdots \\ a_i \\ \vdots \\ a_m \end{pmatrix} = \begin{pmatrix} u_{SB1} \\ u_{SB2} \\ \vdots \\ u_{SBj} \\ \vdots \\ u_{SBn} \end{pmatrix} \quad (1)$$

$$b_i = \frac{1}{\sum_{j=1}^{n} |u_{ij} - u_{SBj}|} \quad (2)$$

$$c_i = \frac{1}{\sum_{j=1}^{n} (u_{ij} - u_{SBj})^2} \quad (3)$$

wherein $u_{ij}$ denotes a displacement of a node j in an i-th order natural vibration deformation mode, $u_{SBj}$ denotes a displacement of node j in springback deformation, and $a_i$, $b_i$, and $c_i$, denote the degree of coincidence between the i-th order natural vibration deformation mode and the springback deformation.

* * * * *